(12) United States Patent
Han et al.

(10) Patent No.: US 12,029,084 B2
(45) Date of Patent: Jul. 2, 2024

(54) DISPLAY SUBSTRATE, FABRICATION METHOD THEREOF AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Linhong Han, Beijing (CN); Xiaofeng Jiang, Beijing (CN); Youngyik Ko, Beijing (CN); Yi Zhang, Beijing (CN); Yang Zhou, Beijing (CN); Yu Wang, Beijing (CN); Shikai Qin, Beijing (CN); Tingliang Liu, Beijing (CN); Haigang Qing, Beijing (CN); Shun Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 501 days.

(21) Appl. No.: 17/312,085

(22) PCT Filed: Dec. 28, 2020

(86) PCT No.: PCT/CN2020/140442
§ 371 (c)(1),
(2) Date: Jun. 9, 2021

(87) PCT Pub. No.: WO2021/190034
PCT Pub. Date: Sep. 30, 2021

(65) Prior Publication Data
US 2022/0406868 A1    Dec. 22, 2022

(30) Foreign Application Priority Data
Mar. 23, 2020 (CN) .......................... 202010209248.4

(51) Int. Cl.
*H10K 59/131* (2023.01)
*H10K 50/844* (2023.01)
(Continued)

(52) U.S. Cl.
CPC ......... *H10K 59/131* (2023.02); *H10K 50/844* (2023.02); *H10K 71/00* (2023.02); *H10K 59/1201* (2023.02)

(58) Field of Classification Search
CPC .... H10K 59/131; H10K 50/844; H10K 71/00; H10K 59/1201; H10K 59/873;
(Continued)

(56) References Cited

U.S. PATENT DOCUMENTS

2019/0148653 A1* 5/2019 Chen ................. H10K 50/8445
345/173
2020/0194468 A1 6/2020 Luo

FOREIGN PATENT DOCUMENTS

CN 107706156 A 2/2018
CN 109459895 A 3/2019
(Continued)

OTHER PUBLICATIONS

CN202010209248.4 First Office Action.
CN202010209248.4 Second Office Action.

*Primary Examiner* — Mohammad A Rahman
(74) *Attorney, Agent, or Firm* — IPro, PLLC (57) ABSTRACT

The embodiments of the present disclosure disclose a display substrate, a fabrication method thereof and a display apparatus. The display substrate includes: a base substrate, including a display region and a bonding region located on at least one side of the display region; a conductive layer, located on the base substrate and in the bonding region and including a plurality of first conducive terminals; and an insulation protection layer, located on one side, facing away (Continued)

from the base substrate, of the conductive layer, and having hollow regions and pattern regions, where the hollow regions cover the first conductive terminals, and the pattern regions cover gaps among the plurality of first conductive terminals.

17 Claims, 6 Drawing Sheets

(51) Int. Cl.
*H10K 59/12* (2023.01)
*H10K 71/00* (2023.01)

(58) Field of Classification Search
CPC . H10K 50/80; G02F 1/133345; G02F 1/1345; G02F 1/13458; G02F 1/13452; G02F 1/1333; G02F 1/133305; G02F 1/133357; G09F 9/301; G09F 9/30; H01L 27/32; H01L 51/52
See application file for complete search history.

(56) References Cited

FOREIGN PATENT DOCUMENTS

| | | |
|---|---|---|
| CN | 110164879 A | 8/2019 |
| CN | 111354774 A | 6/2020 |

* cited by examiner

DISPLAY SUBSTRATE, FABRICATION METHOD THEREOF AND DISPLAY APPARATUS

CROSS-REFERENCE TO RELATED APPLICATIONS

The present application is a US National Stage of International Application No. PCT/CN2020/140442, filed on Dec. 28, 2020, which claims priority to the Chinese Patent Application No. 202010209248.4, filed to the China Patent Office on Mar. 23, 2020 and entitled "DISPLAY SUBSTRATE, FABRICATION METHOD THEREOF AND DISPLAY APPARATUS", the entire contents of which are incorporated herein by reference.

FIELD

The present disclosure relates to the technical field of display, in particular to a display substrate, a fabrication method thereof and a display apparatus.

BACKGROUND

With continuous development of a display technology, a flexible display apparatus has the advantages of being good in impact resistance, light and thin, etc., thereby being applied to electronic equipment more and more widely.

SUMMARY

An embodiment of the present disclosure provides a display substrate, including:

a base substrate, including a display region and a bonding region located on at least one side of the display region;

a conductive layer, located on the base substrate and in the bonding region, where the conductive layer includes a plurality of first conductive terminals; and an insulation protection layer, located on one side, facing away from the base substrate, of the conductive layer; where the insulation protection layer has hollow regions and pattern regions, the hollow regions cover the first conductive terminals, and the pattern regions cover gaps among the plurality of first conductive terminals.

Optionally, in the display substrate provided by the embodiment of the present disclosure, the conductive layer further includes: a plurality of routing wires electrically connected with the plurality of first conductive terminals, the plurality of routing wires are electrically connected with a metal signal line located in the display region, and the pattern regions cover the plurality of routing wires.

Optionally, in the display substrate provided by the embodiment of the present disclosure, the pattern regions further cover side edges, being in contact with the base substrate, of the first conductive terminals.

Optionally, in the display substrate provided by the embodiment of the present disclosure, the plurality of first conductive terminals are divided into a first group of first conductive terminals and a second group of first conductive terminals, and the second group of first conductive terminals are located on one side, close to the display region, of the first group of first conductive terminals; and the pattern regions at least cover gaps among all first conductive terminals in the first group of first conductive terminals.

Optionally, in the display substrate provided by the embodiment of the present disclosure, the pattern regions further cover gaps among all first conductive terminals in the second group of first conductive terminals.

Optionally, in the display substrate provided by the embodiment of the present disclosure, the pattern regions further cover gaps between the first group of first conductive terminals and the second group of first conductive terminals.

Optionally, in the display substrate provided by the embodiment of the present disclosure, a material of the insulation protection layer is an organic material or an inorganic material.

Optionally, in the display substrate provided by the embodiment of the present disclosure, the display region further includes:

a pixel driving circuit, located on the base substrate;

at least one flat layer, located on one side, away from the base substrate, of the pixel driving circuit and having a flat surface and a via hole; and a light-emitting element, located on the flat surface and electrically connected with the pixel driving circuit through the via hole;

where the insulation protection layer and the flat layer are arranged on the same layer.

Optionally, in the display substrate provided by the embodiment of the present disclosure, a thickness of the insulation protection layer is half of that of the flat layer.

Optionally, the display substrate provided by the embodiment of the present disclosure, further includes an encapsulation layer covering the display region, and the insulation protection layer and one layer in the encapsulation layer are arranged on the same layer.

Optionally, in the display substrate provided by the embodiment of the present disclosure, the encapsulation layer includes a first inorganic layer, an organic layer and a second inorganic layer arranged in sequence in a stacked manner, and the insulation protection layer and one of the first inorganic layer, the organic layer and the second inorganic layer are arranged on the same layer.

Optionally, in the display substrate provided by the embodiment of the present disclosure, a metal signal line is a data line, and the first conductive terminals and the data line are arranged on the same layer.

Optionally, in the display substrate provided by the embodiment of the present disclosure, a metal signal line is a gate line, and the first conductive terminals and the gate line are arranged on the same layer.

Based on the same inventive concept, an embodiment of the present disclosure further provides a display apparatus, including the display substrate.

Optionally, the display apparatus provided by the embodiment of the present disclosure, further includes a chip, where the chip includes a plurality of second conductive terminals; and the second conductive terminals are crimped with first conductive terminals of the display substrate.

Optionally, in the display apparatus provided by the embodiment of the present disclosure, orthographic projections of the second conductive terminals on the base substrate are located in orthographic projections of the hollow regions of the insulation protection layer on the base substrate.

Optionally, the display apparatus provided by the embodiment of the present disclosure, further includes a chip on film (COF), where the COF includes a plurality of third conductive terminals; and the third conductive terminals are crimped with first conductive terminals of the display substrate.

Based on the same inventive concept, an embodiment of the present disclosure further provides a fabrication method of a display substrate, including:

forming a conductive layer including a plurality of first conductive terminals in a bonding region of a base substrate; and forming an insulation protection layer with a plurality of hollow regions and pattern regions on one side, facing away from the base substrate, of the conductive layer; where the hollow regions cover the first conductive terminals, and the pattern regions cover gaps among the plurality of first conductive terminals.

DETAILED DESCRIPTION OF THE EMBODIMENTS

In order to make objectives, technical solutions and advantages of embodiments of the present disclosure clearer, the technical solutions of the embodiments of the present disclosure will be clearly and fully described below in combination with the accompanying drawings of the embodiments of the present disclosure. Apparently, the described embodiments are only some, but not all of the embodiments of the present disclosure. Under the condition of no conflict, the embodiments and features of the embodiments in the present disclosure may be mutually combined. Based on the described embodiments of the present disclosure, all other embodiments obtained by those ordinarily skilled in the art without creative work belong to the protection scope of the present disclosure.

Unless otherwise defined, technical or scientific terms used herein should be understood commonly by those ordinarily skilled in the art of the present disclosure. "First", "second" and other similar words used herein do not denote any sequence, quantity or significance, but are only used for distinguishing different components. "Include" or "contain" and other similar words mean that elements or items preceding the word cover elements or items and their equivalents listed after the word without excluding other elements or items. "Connection" or "joint" and other similar words are not limited to physical or mechanical connection, but may also include electrical connection in spite of being direct or indirect. "Inner", "outer", "up", "down" and the like are only used for denoting a relative position relation, and when an absolute position of a described object changes, the relative position relation may change correspondingly.

It should be noted that sizes and shapes of all figures in the drawings do not reflect a true scale and are only intended to illustrate contents of the present disclosure. Same or similar reference numbers denote same or similar elements or elements with the same or similar function all the time.

In the related art, an integrated circuit (IC) in a flexible display apparatus generally adopts a bonding manner of chip on film (COF) for bonding, namely, firstly IC is bonded to a flexible circuit board, then the flexible circuit board with IC bonded thereto is pressed onto a display panel in a press fit manner. As a material of the flexible circuit board is a flexible material, a circuit of an array substrate of the display panel does not break during press fit of IC, however, the cost of COF is high, a circuit of COF may not be too thin, and consequently COF may not be applied to a high-resolution product. Based on this, a manner of chip on plastic (COP) for directly bonding IC to the display panel becomes a future development trend.

The flexible display apparatus may be bent to be a bent form, etc. by the aid of its flexible substrate. However, every coin has two sides, this advantage of the flexible substrate turns out to be its disadvantage, for example, the stress causes deformation. When COF or IC is bonded to the flexible substrate, the flexible substrate is bent and deforms due to stress during bonding, and consequently shorting occurs to the flexible substrate and COF or IC.

Figure 1:
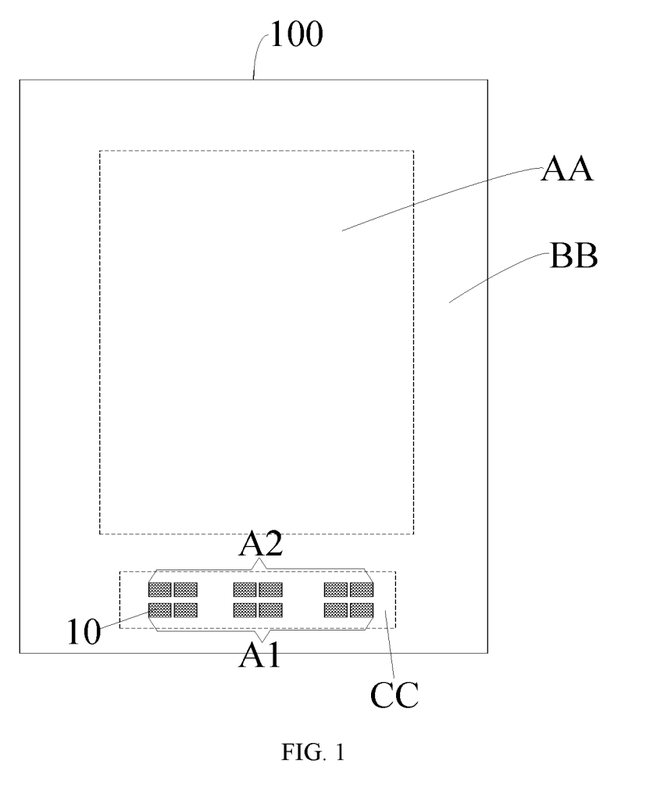
FIG. 1 is a schematic diagram of a top-view structure of region division of a display substrate provided by an embodiment of the present disclosure.
Figure 2:
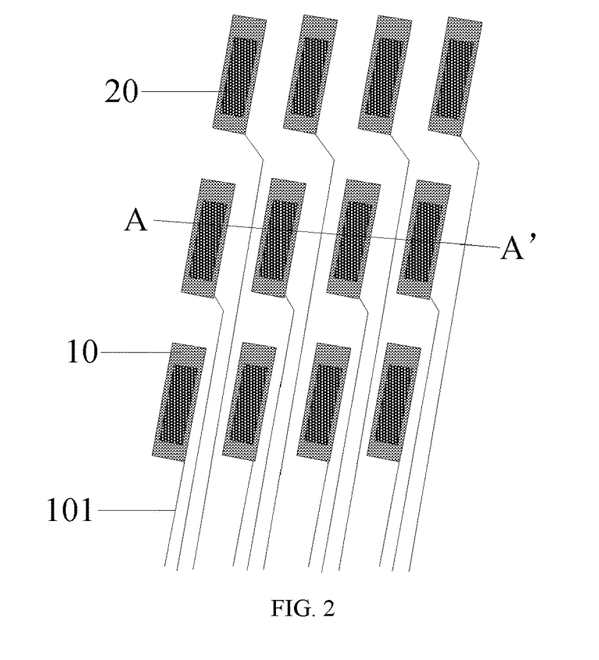
FIG. 2 is a schematic diagram of a top-view structure of a bonding region of a display substrate provided by an embodiment of the present disclosure.

Embodiments of the present disclosure provide a display substrate, as shown in FIG. 1, including: a base substrate 100. The base substrate 100 includes a display region AA and a non-display region BB surrounding the display region A. The non-display region BB located on at least one side of the display region AA includes a bonding region CC. Generally, a region for bonding IC in the non-display region BB is called the bonding region CC. The bonding region CC is provided with a plurality of first conductive terminals 10. Taking a COP bonding manner as an example, the first conductive terminals 10 are used for being crimped with second conductive terminals (described below) on IC, so that IC is electrically connected with the first conductive terminals 10. Specifically, as shown in FIG. 2, the bonding region CC on the base substrate 100 is provided with a conductive layer 200. The conductive layer 200 located in the bonding region CC includes a plurality of first conductive terminals 10 and a plurality of routing wires 101 electrically connected with the first conductive terminals 10; for example, when IC is crimped with the display substrate, the second conductive terminals 20 on IC may be electrically connected with the first conductive terminals 10 on the display substrate, so that a signal on IC is input into the first conductive terminals 10 or signals on the first conductive terminals 10 may be output to IC. The routing wires 101 located in the bonding region CC are electrically connected with metal signal lines (e.g., gate lines, data lines, etc.) of the display region AA, so that signals on the metal signal lines of the display region AA may be input into the first conductive terminals 10, or the signals on the first conductive terminals 10 may be input into the metal signal lines of the display region AA.

Figure 3:
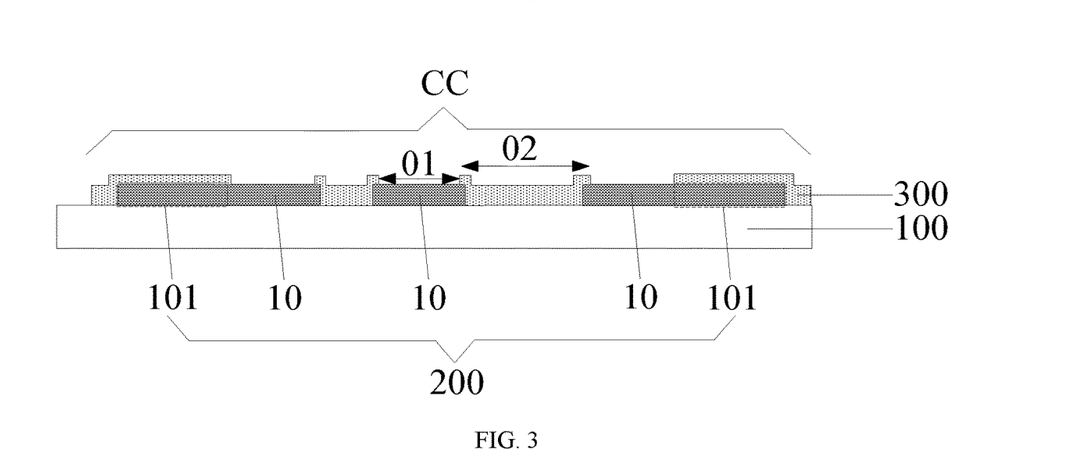
FIG. 3 is a schematic diagram of a sectional structure in an AA' direction of FIG. 2.

Specifically, in the above display substrate provided by the embodiment of the present disclosure, as shown in FIG. 3 which illustrates a sectional view in an AA' direction of FIG. 2, the bonding region CC of the display substrate includes the conductive layer 200 located on the base substrate 100; and the conductive layer 200 includes a plurality of first conductive terminals 10 and a plurality of routing wires 101 electrically connected with the first conductive terminals 10. The routing wire 101 shown on the left side in FIG. 3 is used for being electrically connected with the metal signal line (e.g., the gate line, the data line, etc.). The routing wire 101 shown on the right side in FIG. 3 is used for being electrically connected with a flexible printed circuit (FPC).

Figure 4:
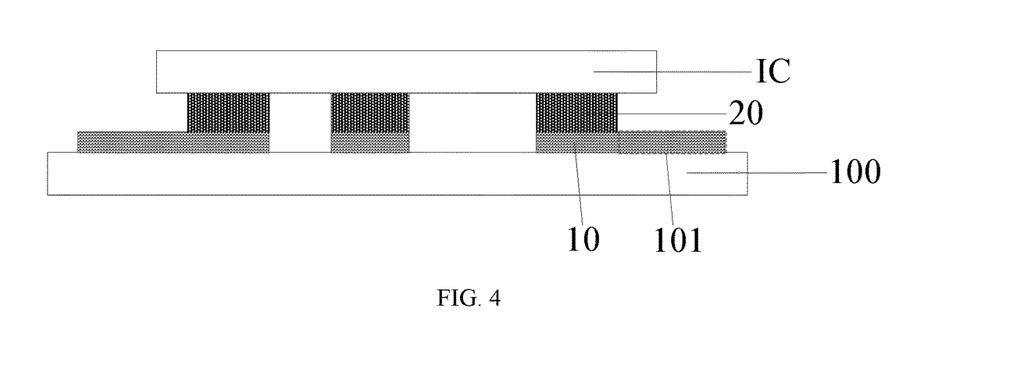
FIG. 4 is a schematic structural diagram of a bonding region of a display substrate before crimping in the related art.
Figure 5:
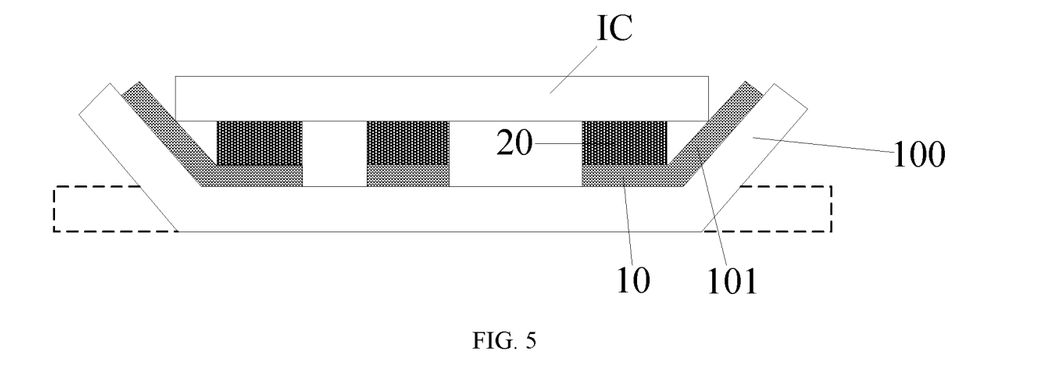
FIG. 5 is a schematic structural diagram of a bonding region of a display substrate after crimping in the related art.

In the related art, as shown in FIG. 4 which illustrates a schematic structural diagram before crimping of IC and a display substrate, and FIG. 5 which illustrates a schematic structural diagram after crimping of IC and a display substrate, while IC is bonded to the display substrate, a certain large pressing force needs to be exerted so as to guarantee a bonding effect, however, the pressing force makes the base substrate warp, leading to warping shown in FIG. 5, consequently shorting or touching occurs to IC and the routing wires 101, then signal transmission is affected, and the display is poor.

Figure 6:
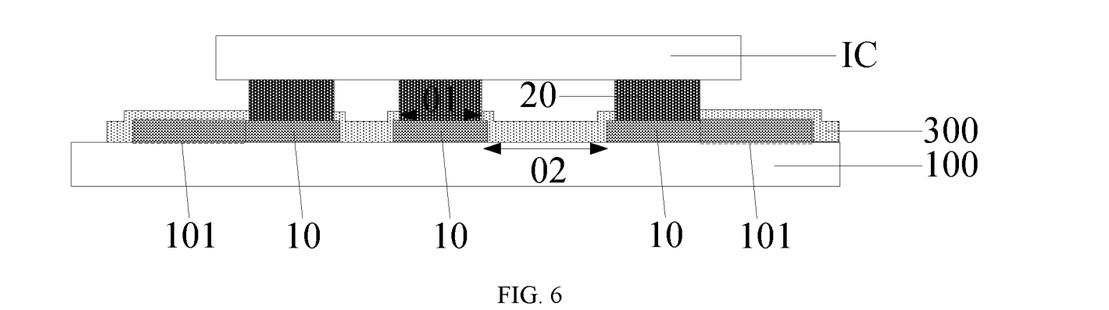
FIG. 6 is a schematic structural diagram of a bonding region of a display substrate before crimping provided by an embodiment of the present disclosure.
Figure 7:
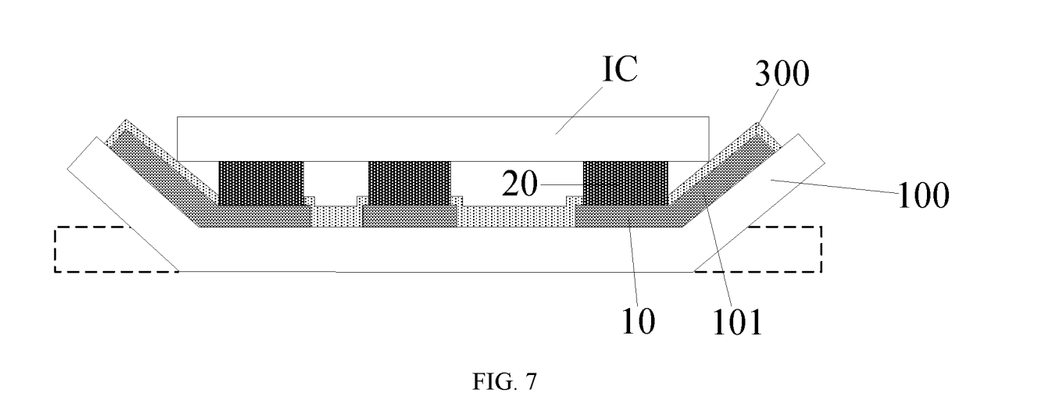
FIG. 7 is a schematic structural diagram of a bonding region of a display substrate after crimping provided by an embodiment of the present disclosure.

Therefore, in the display substrate provided by the embodiment of the present disclosure, as shown in FIG. 3, the bonding region CC further includes an insulation protection layer 300 located on one side, facing away from the base substrate 100, of the conductive layer 200. The insulation protection layer 300 has a plurality of hollow regions 01 and pattern regions 02. The hollow regions 01 cover the first conductive terminals 10, and the pattern regions 02 cover gaps among the plurality of first conductive terminals 10. Thus, the first conductive terminals 10 are exposed out of the hollow regions 01 in the insulation protection layer 300 of the bonding region CC. As the routing wires 101 are located at the gaps among the plurality of first conductive terminals 10, the pattern regions 02 of the insulation protection layer 300 cover the routing wires 101 at the gaps among the plurality of first conductive terminals 10. As shown in FIG. 6 which illustrates a schematic structural diagram before crimping of IC and a display substrate in the present disclosure, and FIG. 7 which illustrates a schematic structural diagram after crimping of IC and a display substrate in the present disclosure, while IC is crimped with the display substrate, though the base substrate 100 is bent and deforms (like a warping phenomenon in FIG. 7) due to stress during bonding, as the pattern regions 02 of the insulation protection layer 300 cover the routing wires 101, shorting does not occur to the routing wires 101 and COF or IC on the base substrate 100.

In the display substrate provided by the embodiment of the present disclosure, the bonding region CC of the display substrate includes the insulation protection layer 300 located on the side, facing away from the base substrate 100, of the conductive layer 200. The insulation protection layer 300 has the hollow regions 01 and the pattern regions 02, the hollow regions 01 cover the first conductive terminals 10, and the pattern regions 02 cover the routing wires 101 at the gaps among the plurality of first conductive terminals 10, so that the first conductive terminals 10 are exposed out of the hollow regions 01 in the insulation protection layer 300 of the bonding region CC, the pattern regions 02 cover the routing wires 101. When the present disclosure adopts the COP bonding, and IC is crimped with the first conductive terminals 10 of the bonding region CC, to make the second conductive terminals on IC be electrically connected with the first conducive terminals 10, though two sides of the base substrate 100 warp, the pattern regions 02 of the insulation protection layer 300 cover the routing wires 101, and thus shorting does not occur to IC and the display substrate. Therefore, the insulation protection layer 300 is arranged so as to prevent the problem of shorting of the bonding region due to warping, etc. during crimping of the bonding region CC of the base substrate 100.

It should be noted that the base substrate provided by the present disclosure is a flexible base substrate, and a material of the flexible base substrate is not specifically limited. For example, the flexible base substrate may be a plastic substrate made of polyimide (PI), polyethylene ether phthalate ester, polyethylene naphthalate, polycarbonate, polyarylate, polyetherimide or polyether sulfone with good heat resistance and durability.

Optionally, as the routing wires are generally electrically connected with side edges of the first conductive terminals, in order to cover the routing wires as completely as possible, in the display substrate provided by the embodiment of the present disclosure, as shown in FIG. 3, the pattern regions 02 further cover side edges, coming into contact with the base substrate 100, of the first conductive terminals 10. In this way, the routing wires are completely covered by the pattern regions 02 of the insulation protection layer 300, so that the problem of shorting of the bonding region caused by warping of the bonding region CC of the base substrate 100 during crimping may be completely avoided.

Optionally, in the display substrate provided by the embodiment of the present disclosure, as shown in FIG. 1, a plurality of first conductive terminals 10 are divided into a first group of first conductive terminals A1 and a second group of first conductive terminals A2, and the second group of first conductive terminals A2 are located on one side, close to the display region AA, of the first group of first conductive terminals A1.

As the first group of first conductive terminals A1 are located in an outside region away from the display region AA, and the outside region is most likely to warp during crimping, the pattern regions 02 in FIG. 3 at least cover gaps among all the first conductive terminals 10 in the first group of first conductive terminals A1 in FIG. 1.

Optionally, as the base substrate is a flexible base substrate, and the base substrate corresponding to each position of the bonding region is likely to deform during crimping, in the display substrate provided by the embodiment of the present disclosure, the pattern regions 02 shown in FIG. 3 further cover gaps among all the first conductive terminals 10 in the second group of first conductive terminals A2 shown in FIG. 1.

Optionally, in order to further avoid the problem of shorting of the bonding region, in the display substrate provided by the embodiment of the present disclosure, the pattern regions 02 shown in FIG. 3 further cover gaps between the first group of first conductive terminals A1 and the second group of first conductive terminals A2. In this way, the gaps among all the first conductive terminals 10 in the bonding region CC have the insulation protection layer 300, so that the problem of shorting of the bonding region caused by warping of the bonding region CC of the base substrate 100 during crimping may be effectively avoided.

Optionally, in the display substrate provided by the embodiment of the present disclosure, a material of the insulation protection layer is not specifically limited and may be an organic material or an inorganic material. Generally, all materials with an insulation function may be used for fabricating the insulation protection layer in the present disclosure.

Optionally, the insulation protection layer may be formed by resin, silicon oxide, silicon nitride, silicon oxynitride, other proper materials or their combination.

Optionally, the insulation protection layer may be fabricated at the same time while its own film layer of the display substrate is fabricated, or may be fabricated independently in the bonding region, which is not specifically limited.

Specifically, the display substrate provided by the embodiment of the present disclosure may be a display substrate or a display panel.

Optionally, the display substrate provided by the embodiment of the present disclosure may adopt a COF bonding manner. The insulation protection layer arranged in the bonding region of the display substrate provided by the embodiment of the present disclosure may be suitable for the COF bonding manner as well. When the present disclosure adopts the COF bonding manner, IC is fabricated on the flexible circuit board, then the flexible circuit board with IC bonded thereto is pressed onto the base substrate in a press fit matter, a position on COF crimped with the base substrate has third conductive terminals. When the third conductive terminals of COF are crimped with the first conductive terminals of the bonding region CC so as to make the third conductive terminals of COF be electrically connected with the first conductive terminals, though the base substrate warps or inaccurate alignment makes the third conductive terminals press the routing wires, as the insulation protection layer 300 covers the routing wires 101, shorting does not occur to COF and the routing wires 101 of the display substrate.

Figure 8:
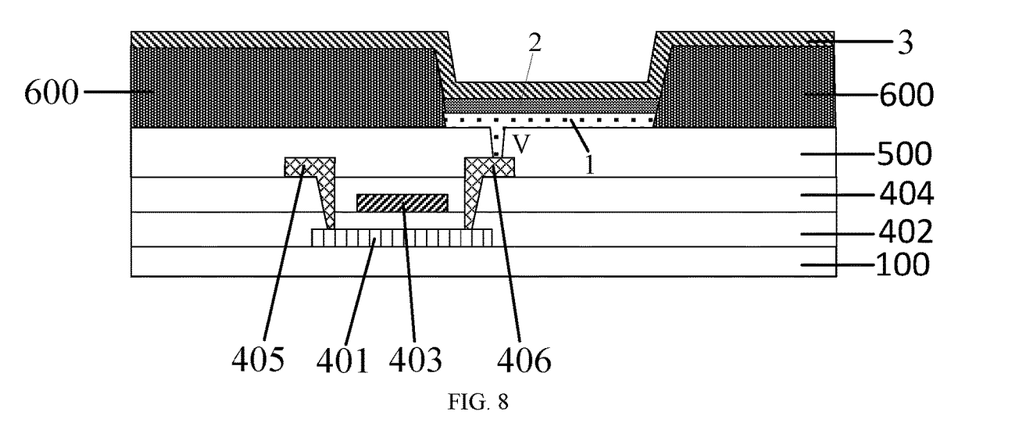
FIG. 8 is a schematic structural diagram of a display region of a display substrate provided by an embodiment of the present disclosure.

Optionally, in the display substrate provided by the embodiment of the present disclosure, as shown in FIG. 8, the display region AA generally includes a plurality of sub-pixels. Each sub-pixel includes a pixel driving circuit located on the base substrate 100, the pixel driving circuit generally includes a transistor located on the base substrate 100, and the transistor includes an active layer 401, a gate insulation layer 402, a gate layer 403, an interlayer insulation layer 404 and a source-drain layer (a source 405 and a drain 406) arranged on the base substrate 100 in sequence. The display region AA further includes at least one flat layer 500 (taking one flat layer 500 as an example in the present disclosure, or arranging two or more flat layers) located on one side, facing away from the base substrate 100, of the pixel driving circuit (the transistor 404). The flat layer 500 has a flat surface and a via hole V. The display region AA further includes a pixel defining layer 600 which defines the plurality of sub-pixels and is located on the flat layer 500. Each sub-pixel further includes a light-emitting element electrically connected with the transistor; the light-emitting element includes an anode 1, a light-emitting layer 2 and a cathode 3 arranged in a stacked manner; and the anode 1 is electrically connected with the drain 406 of the transistor through the via hole V penetrating through the flat layer 500.

Optionally, in the display substrate provided by the embodiment of the present disclosure, as shown in FIG. 3 and FIG. 8, the insulation protection layer 300 of the bonding region CC in the present disclosure may be arranged on the same layer as the flat layer 500 in the display region AA. In this way, patterns of the insulation protection layer 300 and the flat layer 500 may be formed through a single mask patterning process only by changing an original pattern during forming the flat layer 500. A process of independently fabricating the insulation protection layer 300 is not needed, the fabrication flow may be simplified, the production cost is reduced, and the production efficiency is improved.

It should be noted that a structure shown in FIG. 8 in the embodiment of the present disclosure is illustrated by taking one flat layer as an example. Certainly, during specific implementation, two or more flat layers may be included, and in this case, the insulation protection layer may be arranged on the same layer as any one of the flat layers.

Optionally, in the display substrate provided by the embodiment of the present disclosure, as shown in FIG. 3 and FIG. 8, as the first conductive terminals 10 need to be exposed out of the insulation protection layer 300, ideally, the first conductive terminals 10 need to be completely exposed, however, in order to completely cover the routing wires 101, the insulation protection layer 300 generally covers edge portions of the first conductive terminals 10. Thus when IC is crimped with the first conductive terminals 10, in order to make IC be effectively electrically connected with the first conductive terminals 10, a thickness of the insulation protection 300 should not be too large; otherwise, IC may not be electrically connected with the first conductive terminals 10 due to gaps between IC and the first conductive terminals 10 while the insulation protection layer 300 is too thick, and thus the thickness of the insulation protection layer 300 may be half of that of the flat layer 500 in the present disclosure. Besides, a weight of the display substrate may be reduced while the thickness of the insulation protection layer 300 is half of that of the flat layer 500. Specifically, during fabrication, through a single mask patterning process, the flat layer 500 is formed in the display region, and a flat layer is formed in the bonding region CC; then the flat layer of the bonding region CC may be photoetched through a half-tone process; a portion of the flat layer, corresponding to the first conductive terminals 10, of the bonding region CC is completely exposed, and a portion of the flat layer, corresponding to the routing wires 101, of the bonding region CC is exposed by 50%; and therefore the insulation protection layer 300 with the thickness being half of that of the flat layer 500 of the display region is formed.

It should be noted that the thickness of the insulation protection layer 300 being half of that of the flat layer 500 does not represent the only case, and certainly, according to actual demands, the thickness of the insulation protection layer 300 is designed and may be smaller or larger than half of a thickness of the flat layer 500, which belong to the protection scope of the present disclosure.

Specifically, the display substrate provided by the embodiment of the present disclosure may be a display substrate in a liquid-crystal display apparatus or a display substrate in an organic electroluminescence display apparatus.

Specifically, when the display substrate provided by the embodiment of the present disclosure is the display substrate in the organic electroluminescence display apparatus, after light-emitting devices are formed through evaporation on the display substrate, in order to prevent outside water vapor from affecting properties of the light-emitting devices, the light-emitting devices are encapsulated. Therefore, the display substrate provided by the embodiment of the present disclosure further includes an encapsulation layer covering the display region, the encapsulation layer may be one layer, two or more layers, and the insulation protection layer is arranged on the same layer as one film layer of the encapsulation layer. As the insulation protection layer is arranged on the same layer as one film layer of the encapsulation layer, during fabricating the insulation protection layer and one film layer of the encapsulation layer, patterns of the insulation protection layer and one film layer of the encapsulation layer may be formed through a single mask patterning process only by changing an original pattern during forming one film layer of the encapsulation layer, the process of independently fabricating the insulation protection layer is not needed, the fabrication flow may be simplified, the production cost is reduced, and the production efficiency is improved.

Figure 9:
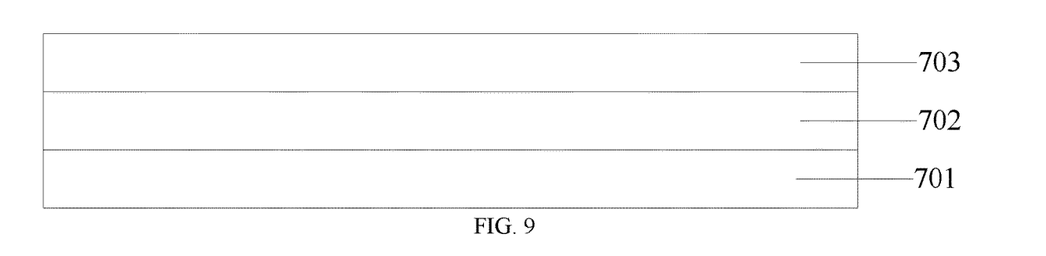
FIG. 9 is a schematic structural diagram of an encapsulation layer, covering a display region, of a display substrate provided by an embodiment of the present disclosure.

Specifically, as shown in FIG. 9, the encapsulation layer covering the display region may include a first inorganic layer 701, an organic layer 702 and a second inorganic layer 703 arranged on the light-emitting device in sequence in a stacked manner. The insulation protection layer 300 in FIG. 3 may be arranged on the same layer as the first inorganic layer 701 or the organic layer 702 or the second inorganic layer 703.

Specifically, when the insulation protection layer is arranged on the same layer as the first inorganic layer or the organic layer or the second inorganic layer, in order to make IC and the first conductive terminals be effectively electrically connected and reduce the weight of the display substrate, the thickness of the insulation protection layer may be half of that of the first inorganic layer or the organic layer or the second inorganic layer.

Optionally, materials of the first inorganic layer 701 and the second inorganic layer 703 are not specifically limited as long as they are inorganic materials. Specifically, the materials of the first inorganic layer 701 and the second inorganic layer 703 may be at least one of silicon nitride, silicon oxide or silicon oxynitride. The material of the first inorganic layer 701 may be same as or different from that of the second inorganic layer 703.

Optionally, in the display substrate provided by the embodiment of the present disclosure, the metal signal lines may be the data lines, and the first conductive terminals may be arranged on the same layer as the data lines. In this case, patterns of the first conductive terminals and the data lines may be formed through a single mask patterning process only by changing an original pattern during forming the data lines, a process of independently fabricating the first conductive terminals is not needed, the fabrication flow may be simplified, the production cost is reduced, and the production efficiency is improved.

Optionally, in the display substrate provided by the embodiment of the present disclosure, the metal signal lines may be the gate lines, and the first conductive terminals may be arranged on the same layer as the gate lines. In this case, patterns of the first conductive terminals and the gate line may be formed through a single mask patterning process only by changing an original pattern during forming the gate line, a process of independently fabricating the first conductive terminals is not needed, the fabrication flow may be simplified, the production cost is reduced, and the production efficiency is improved.

Optionally, in the display substrate provided by the embodiment of the present disclosure, as shown in FIG. 3, the hollow regions 01 may be in one-to-one correspondence with the first conductive terminals 10. Certainly, one hollow region 01 may correspond to the plurality of first conductive terminals 10, which is set according to actual demands.

Based on the same inventive concept, an embodiment of the present disclosure provides a fabrication method of a display substrate. As a principle of solving the problem of the fabrication method is similar to that of solving the problem of the display substrate, implementation of the fabrication method provided by the embodiment of the present disclosure may refer to that of the display substrate provided by the embodiment of the present disclosure, and repetition is omitted herein.

Figure 10:
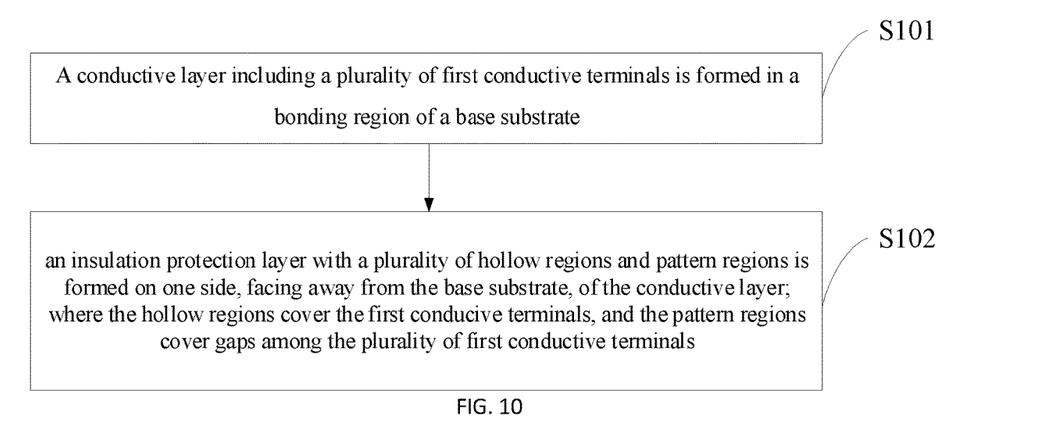
FIG. 10 is a flowchart of a fabrication method of a display substrate provided by an embodiment of the present disclosure.

Specifically, the fabrication method of the display substrate of the embodiment of the present disclosure, as shown in FIG. 10, includes the following steps.

S101, a conductive layer including a plurality of first conductive terminals is formed in a bonding region of a base substrate.

S102, an insulation protection layer with a plurality of hollow regions and pattern regions is formed on one side, facing away from the base substrate, of the conductive layer; where the hollow regions cover the first conducive terminals, and the pattern regions cover gaps among the plurality of first conductive terminals.

Optionally, the fabrication method of the display substrate provided by the embodiment of the present disclosure, further includes: forming at least one flat layer arranged in a display region; and forming the insulation protection layer and the flat layer through a single mask patterning process.

Optionally, the fabrication method of the display substrate provided by the embodiment of the present disclosure, further includes: forming an encapsulation layer covering the display region; and forming the insulation protection layer and one film layer of the encapsulation layer through a single mask patterning process.

It should be noted that in the fabrication method provided by the embodiment of the present disclosure, patterning process for forming structures of all layers not only include part of or all of processes like deposition, photoresist coating, mask plate masking, exposure, developing, etching, photoresist stripping, etc., but also include other processes, specifically, a needed pattern in the actual fabrication process prevails, which is not limited herein. For example, a postbaking process may be further included after developing and before etching.

The deposition process may be a chemical vapor deposition method, a plasma enhancing chemical vapor deposition method or a physical vapor deposition method, which is not limited herein. A mask used in the masking process may be a half tone mask, a modified single mask, a single slit mask or a gray tone mask, which is not limited herein. Etching may be dry etching or wet etching, which is not limited herein.

In order to better understand the technical solutions of the present disclosure, the fabrication process of the display substrate shown in FIG. 3 and FIG. 8 will be described in detail below, taking the insulation protection layer 300 of the display substrate in FIG. 3 and a flat layer 500 in the display region in FIG. 8 being arranged on the same layer as an example.

Specifically, the fabrication process of the display substrate shown in FIG. 3 and FIG. 8 is as follows.

Figure 11A:
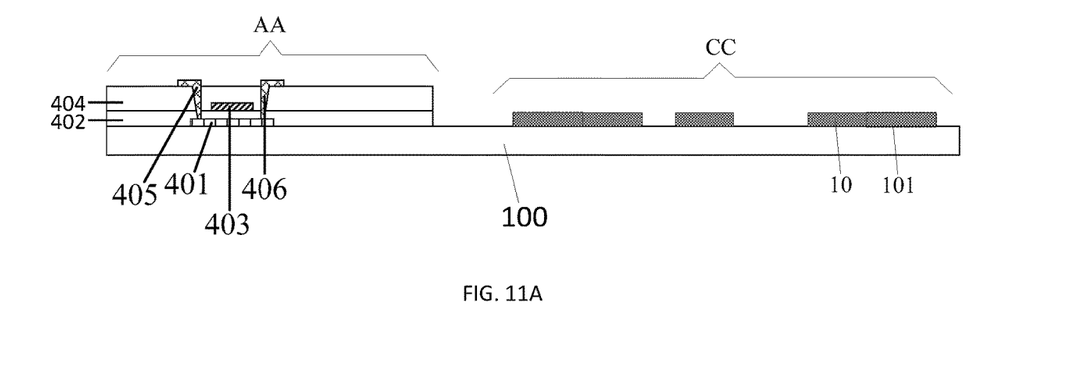
FIG. 11A and FIG. 11B are schematic diagrams of sectional structures after each step of a fabrication method is performed provided by an embodiment of the present disclosure.

The base substrate 100 is provided, e.g., a flexible substrate made of polyimide; an oxide layer is deposited in the display region AA of the base substrate 100 and is patterned to form an active layer 401; a gate insulation layer 402 is deposited on the active layer 401; a metal material is deposited on the gate insulation layer 402, and the metal material film layer is patterned to form a gate 403; an interlayer insulation layer 404 is deposited on the gate 403; a source-drain layer including a source 405, a drain 406 and a data line (not shown) is fabricated in the display region AA on the interlayer insulation layer 404 through a single mask patterning process, the conductive layer 200 is formed in a bonding region CC, and the conductive layer 200 and the source-drain layer are arranged on the same layer (or the conductive layer 200 is fabricated while the gate 403 is fabricated). The conductive layer 200 includes the plurality of first conductive terminals 10 and routing wires 101 electrically connected with the first conductive terminals 10, and thus fabrication of a transistor of the display region AA and fabrication of the conductive layer 200 of the bonding region are finished, as shown in FIG. 11A.

An organic material film layer is deposited on the transistor of the display region AA and in the bonding region CC of the base substrate 100, and the organic material film layer is patterned. A via hole which is connected with a drain 406 of the transistor and an anode 1 of a light-emitting device fabricated subsequently is formed in the organic material film layer of the display region AA, thus the flat layer 500 is formed in the display region, meanwhile, the organic material film layer in the bonding region CC is subjected to exposure and developing through a patterning process, and thus the insulation protection layer 300 with the plurality of hollow regions 01 and with a thickness being half of that of the flat layer 500 is formed. Orthographic projections of the hollow regions 01 on the base substrate 100 cover orthographic projections of the first conductive terminals 10 on the base substrate 100, and orthographic projections of patterns of the insulation protection layer 300 on the base substrate 100 cover orthographic projections of the routing wires 101 on the base substrate 100, as shown in FIG. 11B.

Thus, fabrication of the display substrate shown in FIG. 3 and FIG. 8 is finished.

Figure 11B:
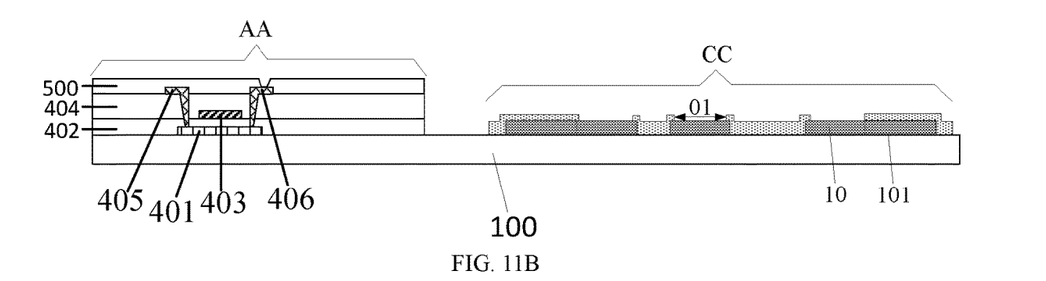

Specifically, after FIG. 11B, fabrication of the anode 1, a pixel defining layer 600, a light-emitting layer 2, a cathode 3, the encapsulation layer, etc. is further included. The fabrication method of these film layers is the same as that of the related art and will not be described in detail herein. In the bonding region CC, the crimping process of IC and the first conductive terminals 10 is further included, and description of the crimping process of IC and the first conductive terminals 10 may refer to the embodiments of the display substrate.

Based on the same inventive concept, an embodiment of the present disclosure further provides a display apparatus, including the display substrate provided by the embodiment of the present disclosure. A principle of solving the problem of the display apparatus is similar to that of solving the problem of the display substrate, and thus implementation of the display apparatus may refer to that of the display substrate; and repetition is omitted herein.

Optionally, in the display apparatus provided by the embodiment of the present disclosure, IC may be bonded to the display substrate in a COP bonding manner, specifically, as shown in FIG. 6, the display apparatus further includes a chip IC. The chip IC includes a plurality of second conductive terminals 20, and the second conductive terminals 20 are crimped with first conductive terminals 10 of the display substrate. Specifically, the second conductive terminals 20 of the chip IC are crimped with first conductive terminals 10 of the display substrate, as the first conductive terminals 10 are electrically connected with a signal line of a display region, then a signal on the chip IC may be input into the signal line or a signal on the signal line may be input into the chip IC.

Optionally, in the display apparatus provided by the embodiment of the present disclosure, as shown in FIG. 6, the second conductive terminals 20 of the chip IC are crimped with the first conductive terminals 10 on the base substrate 100 through hollow regions 01 of the an insulation protection layer 300 in the display substrate. In order to guarantee that the second conductive terminals 20 are electrically connected with the first conductive terminals 10, orthographic projections of the second conductive terminals 20 on the base substrate 100 should be located in a range of orthographic projections of the hollow regions 01 of the insulation protection layer 300 on the base substrate 100; or the orthographic projections of the second conductive terminals 20 on the base substrate 100 overlap with the orthographic projections of the hollow regions 01 of the insulation protection layer 300 on the base substrate 100. During crimping of the chip IC and the display substrate, in order to make the second conductive terminals 20 on the chip IC be electrically connected with the first conductive terminals 10 on the base substrate 100, the orthographic projections of the second conductive terminals 20 on the base substrate 100 are preferably located in the range of the orthographic projections of the hollow regions 01 of the insulation protection layer 300 on the base substrate 100.

Figure 12:
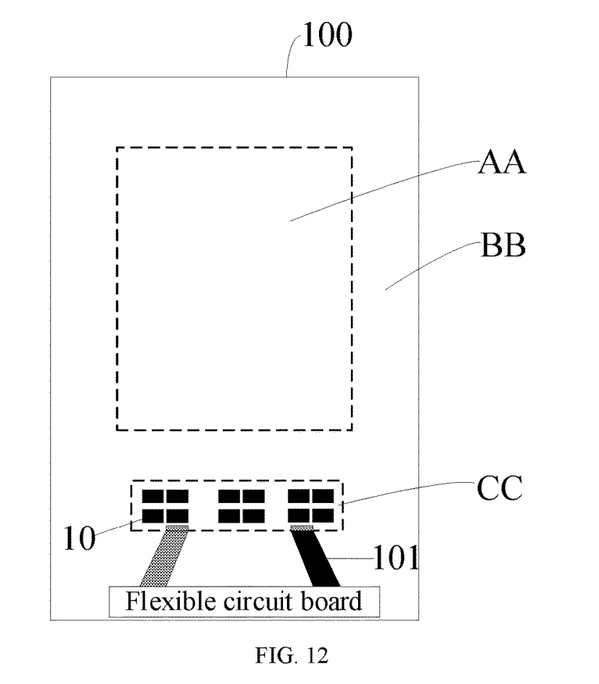
FIG. 12 is a schematic diagram of a top-view structure of a display apparatus provided by an embodiment of the present disclosure.

It should be noted that as shown in FIG. 12, after crimping of IC and the display substrate in the display apparatus, a non-display region BB further includes a FPC, and FPC is used for being electrically connected with IC through routing wires.

Optionally, in the display apparatus provided by the embodiment of the present disclosure, IC may be bonded to the display substrate in a COF bonding manner. Specifically, the display apparatus further includes a COF. The COF includes a plurality of third conductive terminals. The third conductive terminals are crimped with the first conductive terminals of the display substrate. In order to guarantee that the third conductive terminals are electrically connected with the first conductive terminals, orthographic projections of the third conductive terminals on the base substrate should be located in the range of the orthographic projections of the hollow regions of the insulation protection layer on the base substrate; or the orthographic projections of the third conductive terminals on the base substrate overlap with the orthographic projections of the hollow regions of the insulation protection layer on the base substrate. During crimping of the chip IC and the display substrate, in order to make the third conductive terminals on the chip IC be electrically connected with the first conductive terminals on the base substrate, the orthographic projections of the third conductive terminals on the base substrate are preferably located in the range of the orthographic projections of the hollow regions of the insulation protection layer on the base substrate.

During specific implementation, in the embodiment of the present disclosure, the display apparatus may be: a mobile phone, a tablet PC, a television, a display, a laptop, a digital photo frame, a navigator, any other product or part with a display function. Other necessary components of the display apparatus should be understood by those ordinarily skilled in the art and will neither be described in detail herein nor limit the preset disclosure.

According to the display substrate, the fabrication method thereof and the display apparatus provided by the embodiments of the present disclosure, the bonding region of the display substrate includes the insulation protection layer located on the side, facing away from the base substrate, of the conductive layer. As the insulation protection layer has the hollow regions, the orthographic projections of the hollow regions on the base substrate cover the orthographic projections of the first conductive terminals on the base substrate, and the orthographic projections of the patterns of the insulation protection layer on the base substrate cover the orthographic projections of the routing wires on the base substrate, the first conductive terminals are exposed out of the hollow regions of the insulation protection layer in the bonding region, and the patterns of the insulation protection layer partially cover the routing wires. When the present disclosure adopts COP bonding, and IC is crimped with the first conductive terminals of the bonding region so as to make the second conductive terminals on IC be electrically connected with the first conductive terminals, though the two sides of the base substrate warp, as the insulation protection layer covers the routing wires, shorting does not occur to IC and the display substrate. Therefore, the insulation protection layer is arranged so as to prevent the problem of shorting of the bonding region due to warping, etc. during crimping of the bonding region of the base substrate.

Though the preferred embodiments of the present disclosure are described, those skilled in the art may make other changes and modifications for these embodiments once they know the basic creative concept. Therefore, the appended claims intend to be constructed as including the preferred embodiments and all changes and modifications which fall in the scope of the present disclosure.

Apparently, those skilled in the art may make various changes and transformations for the embodiments of the present disclosure without departing from the spirit and scope of the embodiments of the present disclosure. In this case, if these changes and transformations of the embodiments of the present disclosure belong to the scope of claims and their equivalents, the present disclosure indents to include these changes and transformations.

What is claimed is:

1. A display substrate, comprising:
   a base substrate comprising a display region and a bonding region arranged on at least one side of the display region;
   a conductive layer arranged on the base substrate and in the bonding region, wherein the conductive layer comprises a plurality of first conductive terminals; and
   an insulation protection layer arranged on one side, facing away from the base substrate, of the conductive layer, wherein the insulation protection layer has hollow regions and pattern regions, the hollow regions cover the plurality of first conductive terminals, and the pattern regions cover gaps among the plurality of first conductive terminals;
   wherein the display region further comprises:
   a pixel driving circuit arranged on the base substrate;
   at least one flat layer arranged on one side, away from the base substrate, of the pixel driving circuit, wherein the at least one flat layer has a flat surface and a via hole; and
   a light-emitting element arranged on the flat surface and electrically connected with the pixel driving circuit through the via hole;
   wherein the insulation protection layer and the at least one flat layer are arranged on a same layer.

2. The display substrate according to claim 1, wherein the conductive layer further comprises: a plurality of routing wires electrically connected with the plurality of first conductive terminals,
   the plurality of routing wires are electrically connected with a metal signal line arranged in the display region, and
   the pattern regions cover the plurality of routing wires.

3. The display substrate according to claim 1, wherein the pattern regions further cover side edges, being in contact with the base substrate, of the plurality of first conductive terminals.

4. The display substrate according to claim 1, wherein the plurality of first conductive terminals are divided into a first group of first conductive terminals and a second group of first conductive terminals;
   the second group of first conductive terminals are arranged on one side, close to the display region, of the first group of first conductive terminals; and
   the pattern regions at least cover gaps among all first conductive terminals in the first group of first conductive terminals.

5. The display substrate according to claim 4, wherein the pattern regions further cover gaps among all first conductive terminals in the second group of first conductive terminals.

6. The display substrate according to claim 5, wherein the pattern regions further cover gaps between the first group of first conductive terminals and the second group of first conductive terminals.

7. The display substrate according to claim 1, wherein a material of the insulation protection layer is an organic material or an inorganic material.

8. The display substrate according to claim 1, wherein a thickness of the insulation protection layer is half of that of the at least one flat layer.

9. The display substrate according to claim 1, further comprising an encapsulation layer covering the display region,
   wherein the insulation protection layer and one layer in the encapsulation layer are arranged on a same layer.

10. The display substrate according to claim 9, wherein the encapsulation layer comprises a first inorganic layer, an organic layer and a second inorganic layer arranged in sequence in a stacked manner, and
    the insulation protection layer and one of the first inorganic layer, the organic layer and the second inorganic layer are arranged on the same layer.

11. The display substrate according to claim 2, wherein the metal signal line is a data line, and the plurality of first conductive terminals and the data line are arranged on a same layer.

12. The display substrate according to claim 2, wherein the metal signal line is a gate line, and the plurality of first conductive terminals and the gate line are arranged on a same layer.

13. A display apparatus, comprising the display substrate according to claim 1.

14. The display apparatus according to claim 13, further comprising a chip;
    wherein the chip comprises a plurality of second conductive terminals; and
    the plurality of second conductive terminals are crimped with the plurality of first conductive terminals of the display substrate.

15. The display apparatus according to claim 14, wherein orthographic projections of the plurality of second conductive terminals on the base substrate are arranged in orthographic projections of the hollow regions of the insulation protection layer on the base substrate.

16. The display apparatus according to claim 13, further comprising a chip on film (COF);
   wherein the COF comprises a plurality of third conductive terminals; and
   the plurality of third conductive terminals are crimped with the plurality of first conductive terminals of the display substrate.

17. A fabrication method of the display substrate according to claim 1, comprising:
   forming the conductive layer comprising the plurality of first conductive terminals in the bonding region of the base substrate; and
   forming the insulation protection layer with a plurality of hollow regions and the pattern regions on one side, facing away from the base substrate, of the conductive layer;
   wherein the hollow regions cover the plurality of first conductive terminals, and the pattern regions cover the gaps among the plurality of first conductive terminals.

* * * * *